United States Patent
Lee

(10) Patent No.: US 12,471,261 B2
(45) Date of Patent: Nov. 11, 2025

(54) HEAT DISSIPATION DEVICE FOR DISPLAY, AND MANUFACTURING METHOD THEREFOR

(71) Applicant: TAEIN LEADING THERMAL SOLUTIONS CO., LTD., Gunpo-si (KR)

(72) Inventor: Yong-Duck Lee, Anyang-si (KR)

(73) Assignee: TAEIN LEADING THERMAL SOLUTIONS CO., LTD., Gunpo-si (KR)

( * ) Notice: Subject to any disclaimer, the term of this patent is extended or adjusted under 35 U.S.C. 154(b) by 222 days.

(21) Appl. No.: 18/548,097

(22) PCT Filed: Jan. 17, 2022

(86) PCT No.: PCT/KR2022/000853
§ 371 (c)(1),
(2) Date: Aug. 27, 2023

(87) PCT Pub. No.: WO2022/211237
PCT Pub. Date: Oct. 6, 2022

(65) Prior Publication Data
US 2024/0155819 A1    May 9, 2024

(30) Foreign Application Priority Data
Apr. 2, 2021    (KR) .......................... 10-2021-0043387

(51) Int. Cl.
*H05K 7/20*     (2006.01)
*H05K 9/00*     (2006.01)

(52) U.S. Cl.
CPC ..... *H05K 7/20963* (2013.01); *H05K 7/20509* (2013.01); *H05K 9/0015* (2013.01)

(58) Field of Classification Search
CPC ........... H05K 7/20963; H05K 7/20509; H05K 9/0015
See application file for complete search history.

(56) References Cited

U.S. PATENT DOCUMENTS

| | | | | |
|---|---|---|---|---|
| 7,164,587 | B1 * | 1/2007 | Garnett | ................... H01L 23/36 174/362 |
| 2004/0132331 | A1 * | 7/2004 | Osborn | ................. H01L 23/552 257/E23.114 |
| 2009/0091902 | A1 | 4/2009 | Kim | |
| 2021/0020542 | A1 * | 1/2021 | Kumura | ............... H05K 9/0032 |

FOREIGN PATENT DOCUMENTS

| | | | | |
|---|---|---|---|---|
| KR | 20-0307398 Y1 | 3/2003 | | |
| KR | 10-2009-0034596 A | 4/2009 | | |
| KR | 10-2010-0054356 A | 5/2010 | | |
| KR | 10-2011-0054223 A | 5/2011 | | |
| KR | 20150100609 A * | 9/2015 | ............. | C08K 3/013 |
| KR | 10-2017-0010179 A | 1/2017 | | |

* cited by examiner

*Primary Examiner* — Mukundbhai G Patel
(74) *Attorney, Agent, or Firm* — You & IP, LLC

(57) ABSTRACT

Disclosed are a heat dissipation device for a display and a manufacturing method therefor. The heat dissipation device for a display enables the heat generated in a central processing unit provided in a flat panel display device to be quickly discharged to the outside and enables the thickness of the heat dissipation device to be minimized, and thus the overall thickness of the display device can be slim.

6 Claims, 7 Drawing Sheets

HEAT DISSIPATION DEVICE FOR DISPLAY, AND MANUFACTURING METHOD THEREFOR

TECHNICAL FIELD

The present disclosure relates to a heat dissipation device for a display, and a manufacturing method therefor. More particularly, the present disclosure relates to a heat dissipation device for a display, and a manufacturing method therefor, the heat dissipation device enabling heat generated in a central processing unit provided in a flat panel display device to be quickly discharged to the outside and enabling the thickness of the heat dissipation device to be minimized, thereby achieving slimness of the overall thickness of the display device.

BACKGROUND ART

In general, a display device refers to a device that displays characters or figures on a Braun tube similar to a TV receiver. Among them, a flat panel display (FPD) refers to a display device that is thinner and lighter than a computer monitor or a television using a cathode ray tube. The FPD has been applied to devices for which portability is important, such as a laptop computer and a digital camera, etc., but has recently been applied to a bulky device such as a flat panel TV. Accordingly, the FPD is used as a display device that has advantages such as thinness and lightweight, low driving voltage, and low power consumption.

Such an FPD device is required to achieve slimness of the thickness along with enlargement in size. The FPD device, such as the flat panel TV, has been highly specified and is highly functional, and accordingly, heat generation due to an increase in CPU processing speed has emerged as a major problem.

Therefore, a heat dissipation unit is usually used to quickly dissipate heat generated in a central processing unit (CPU) outwards. For example, the heat dissipation unit is mainly installed in form of a heat pipe on an upper part of a main board CPU of the display device so that the heat generated in the CPU is dissipated through the heat dissipation unit.

In addition, in the FPD device, a large amount of electromagnetic waves including non-ionizing radiation such as microwaves and radio waves are emitted. Concern about the effect of electromagnetic waves on human health is increasing, and also interference with other equipment caused by electromagnetic waves is a problem. In particular, electromagnetic waves generated during operation of a FPD device cause serious damage to electronic devices around the FPD device.

Therefore, in order to shield electromagnetic waves generated in electronic components mounted to a circuit board or to protect the electronic components mounted to the circuit board from electromagnetic waves generated in the outside space, an EMI gasket having electrical conductivity and elasticity may be applied to the circuit board and the heat dissipation unit.

EMI means electromagnetic waves interruption (electromagnetic interference). Since the heat dissipation unit made of metal serves as an antenna, electromagnetic waves generated in the electronic components mounted to a main board are grounded outwards of the display device through a heatsink and the EMI gasket.

A conventional heat dissipation unit is formed by pressing a center area of an aluminum plate using a press device to form a semiconductor contact portion in which an area of the CPU is depressed, and then a lower portion of the semiconductor contact portion is adhered to an upper surface of the CPU. A part of a planar part of the heat dissipation unit that is not depressed is brought into contact with an upper surface of the EMI gasket. Since a metallic film is adhered or coated on a surface of the EMI gasket, the EMI gasket can be electrically connected to the aluminum heat dissipation unit.

However, the conventional heat dissipation unit having the above-described structure has a problem in that the overall height thereof is increased due to the height of the EMI gasket, and thus the thickness of the FPD cannot be made slim.

DISCLOSURE

Technical Problem

Accordingly, the present disclosure has been made keeping in mind the above problems occurring in the related art, and the present disclosure is intended to propose a heat dissipation device for a display and a manufacturing method therefor, wherein the heat dissipation device discharging heat generated in a central processing unit (CPU) provided in a flat panel display device has a heatsink unit having a minimized thickness, thereby achieving the slimness of the entire flat panel display device.

Another objective of the present disclosure is to provide a heat dissipation device for a display and a manufacturing method therefor, wherein the press processing having the relatively low processing cost may be used alone to process a heatsink unit, thereby achieving the slimness of the entire thickness and reducing the production cost thereof.

Technical Solution

In order to achieve the above-described objectives, the present disclosure includes a heat dissipation device for a display, the heat dissipation device including a flat panel heatsink unit comprising a central processing unit (CPU) contacting part, a push pin coupling part, and an EMI gasket contacting part, and a heat dissipation plate connected to and installed at the heatsink unit, wherein the EMI gasket contacting part may have a first inserting groove into which an upper end of an EMI gasket may be inserted.

A heat dissipation device for a display, the heat dissipation device including a flat panel heatsink unit comprising a central processing unit (CPU) contacting part, a push pin coupling part, and an EMI gasket contacting part, and a heat dissipation plate connected to and installed at the heatsink unit, wherein the EMI gasket contacting part may have a first through hole, and may be configured to support an inside surface of the first through hole to be in contact therewith.

A heat dissipation device for a display, the heat dissipation device including a flat panel heatsink unit including a central processing unit (CPU) contacting part, a push pin coupling part, and an EMI gasket contacting part, and a heat dissipation plate connected to and installed at the heatsink unit, wherein the CPU contacting part may protrude upwards or depress downwards by a bent part to cause a height difference from the heatsink unit around the CPU contacting part, a first through hole into which an upper end of the EMI gasket may be inserted may be formed at the EMI gasket contacting part formed in the heatsink unit located at a relatively high position, and a first inserting groove into which the upper end of the EMI gasket may be inserted may be formed at the EMI gasket contacting part formed in the heatsink unit located at a relatively low position.

The push pin coupling part may have a second inserting groove into which a pressing part of a push pin may be inserted, and a center portion of the second inserting groove may have a third through hole through which a head part of the push pin may pass.

Meanwhile, according to the present disclosure, a manufacturing method for the heat dissipation device for display device is formed such that, the heatsink unit may be formed by press processing, and the push pin coupling part may be formed by first punching in which a through hole larger than a diameter of a push pin may be formed by punching on a flat heatsink unit, pressing a portion around the through hole by a pressing tool having a diameter larger than a diameter of the through hole to form a second inserting groove into which a pressing part of the pushpin may be inserted, and second punching in which the through hole with a diameter narrowed by the pressing may be additionally processed by punching to form a third through hole through which a head part of the push pin may pass.

Advantageous Effects

According to the present disclosure, heat generated in the CPU provided in the flat panel display device can be quickly discharged outwards and the thickness of the heat dissipation device can be minimized, so that there is the excellent effect that the slimness of the entire display device can be achieved.

Furthermore, according to the present disclosure, the thickness of the heat dissipation device can be minimized and the press processing having a relatively low processing cost is used alone to process the heatsink unit, and therefore, there is an additional effect that the entire production cost can be reduced.

BEST MODE

Hereinbelow, exemplary embodiments of a heat dissipation device for a display according to the present disclosure and a manufacturing method therefor will be described in detail with reference to accompanying drawings.

Figure 1:
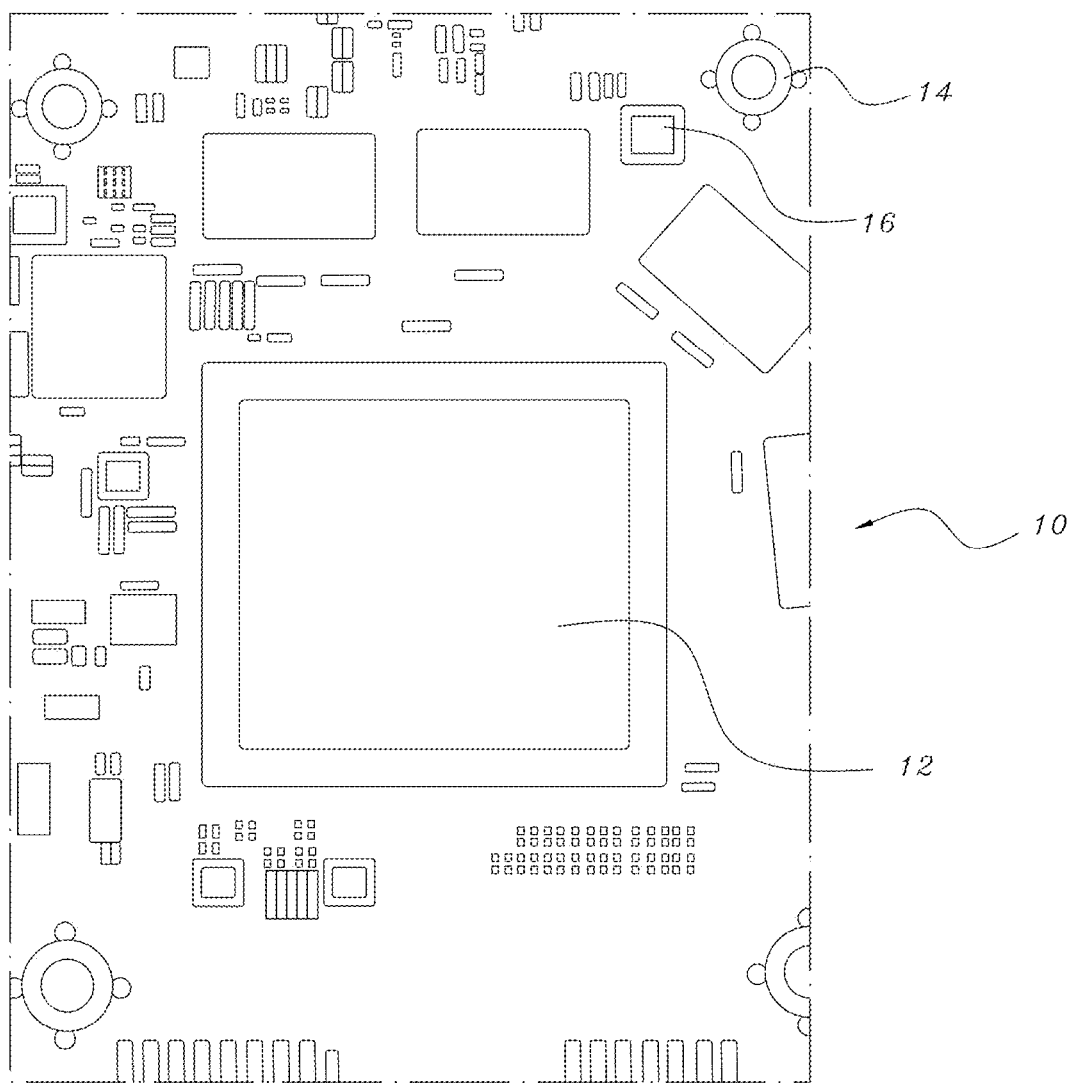
FIG. 1 is a view showing a printed circuit board used for a flat panel display.
Figure 2:
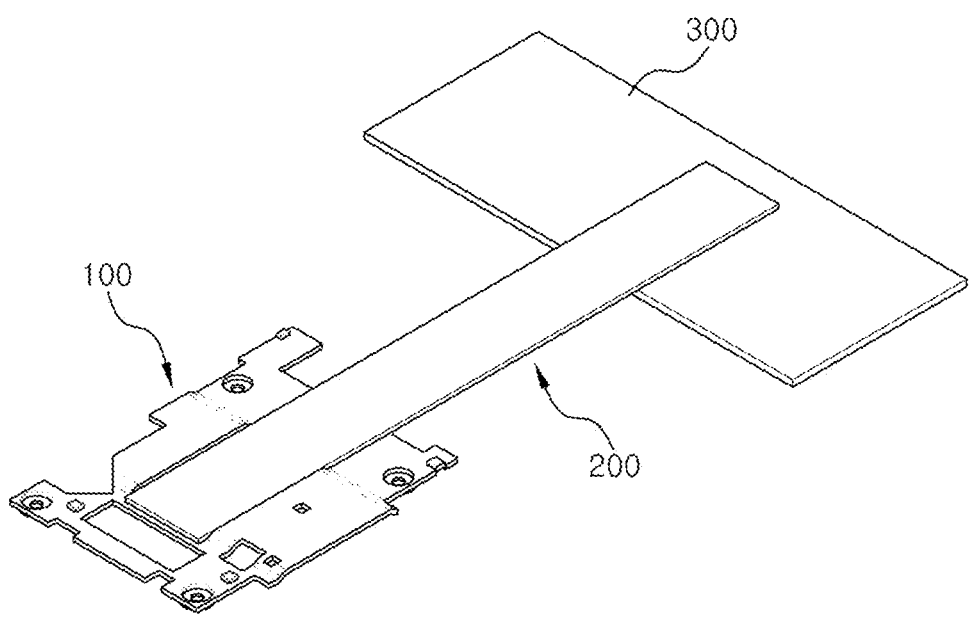
FIG. 2 is a view showing an embodiment of a heat dissipation device for a display according to the present disclosure.
Figure 3A:
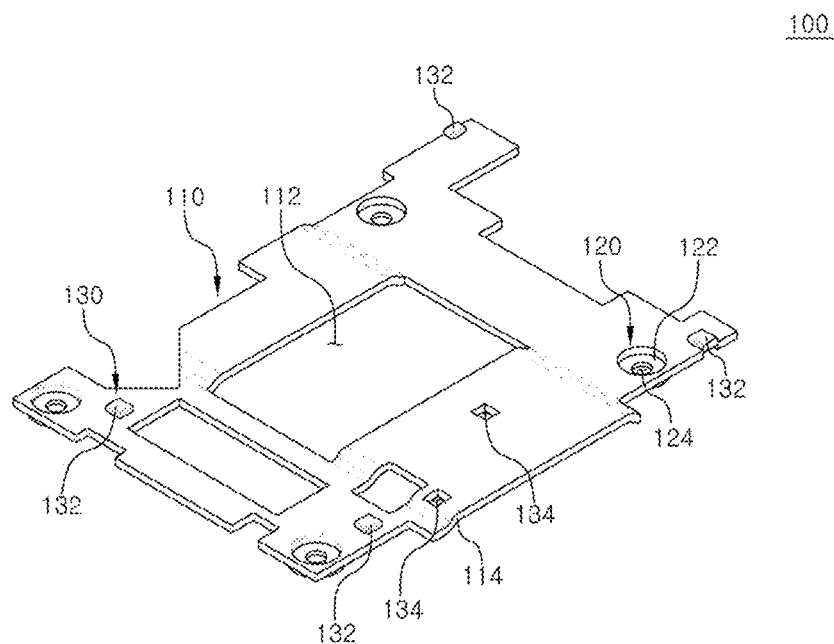
FIG. 3A and FIG. 3B are an upper perspective view and a lower perspective view showing a heatsink unit of the present disclosure shown in FIG. 2.
Figure 3B:
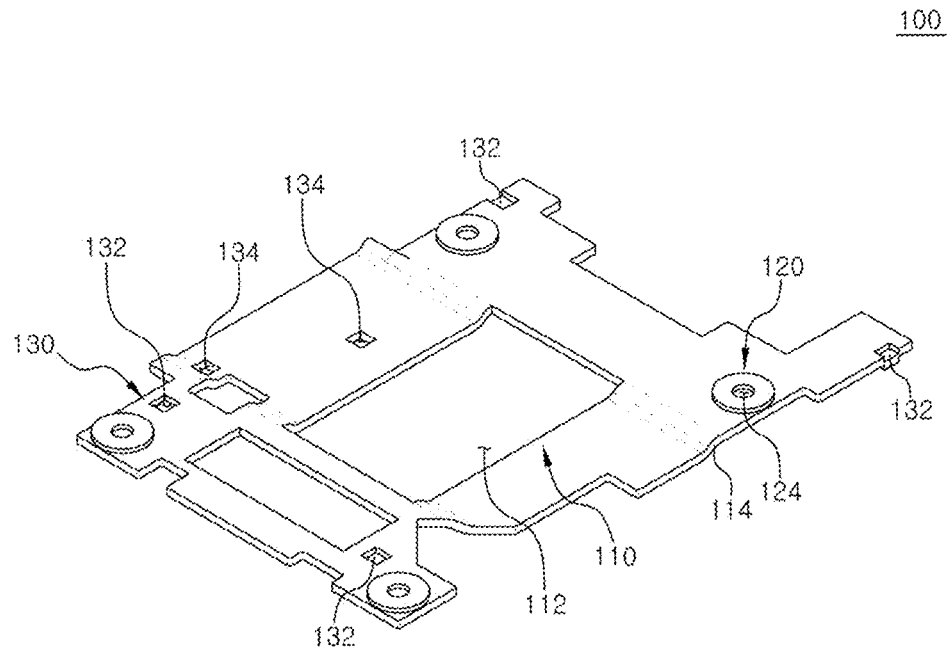
Figure 4:
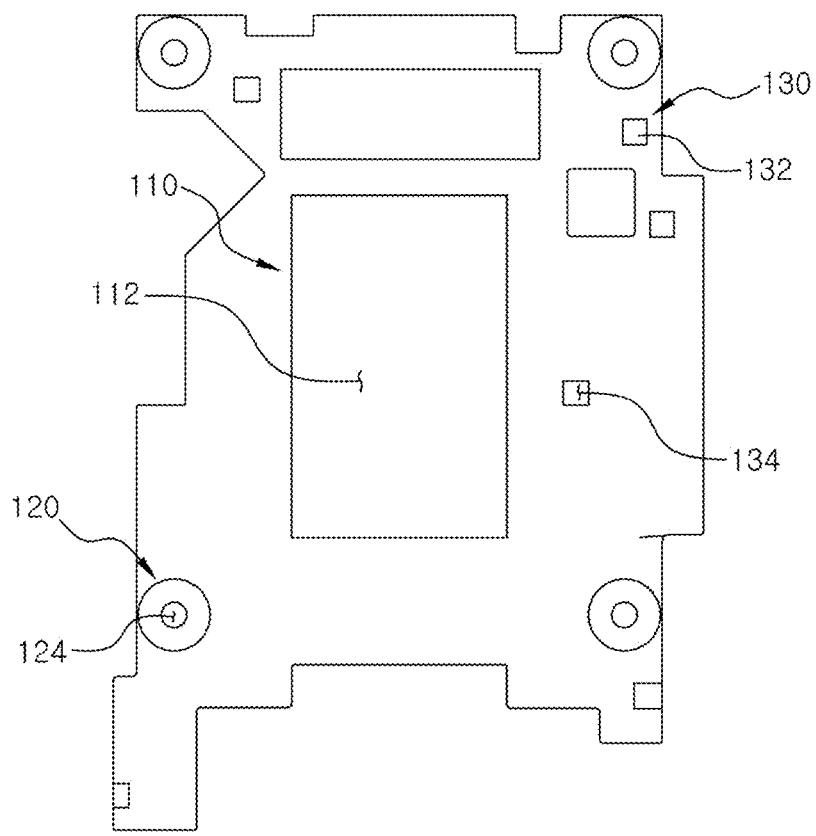
FIG. 4 is a bottom view of the present disclosure shown in FIG. 3A.
Figure 5A:
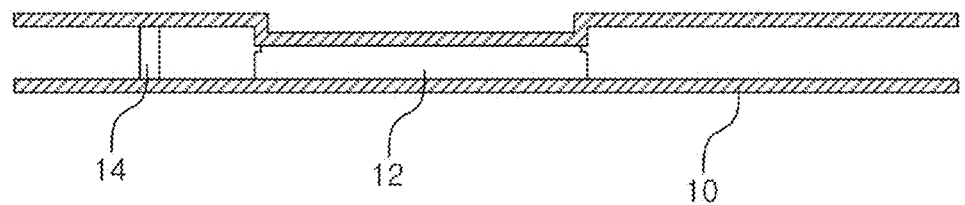
FIG. 5A and FIG. 5B are side sectional views showing the heatsink unit shown in FIG. 3A and FIG. 3B in comparison with the conventional heatsink unit.
Figure 5B:
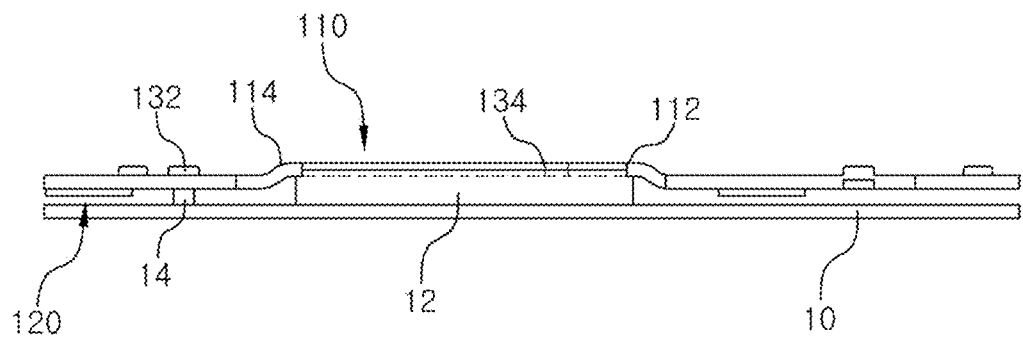
Figure 6:
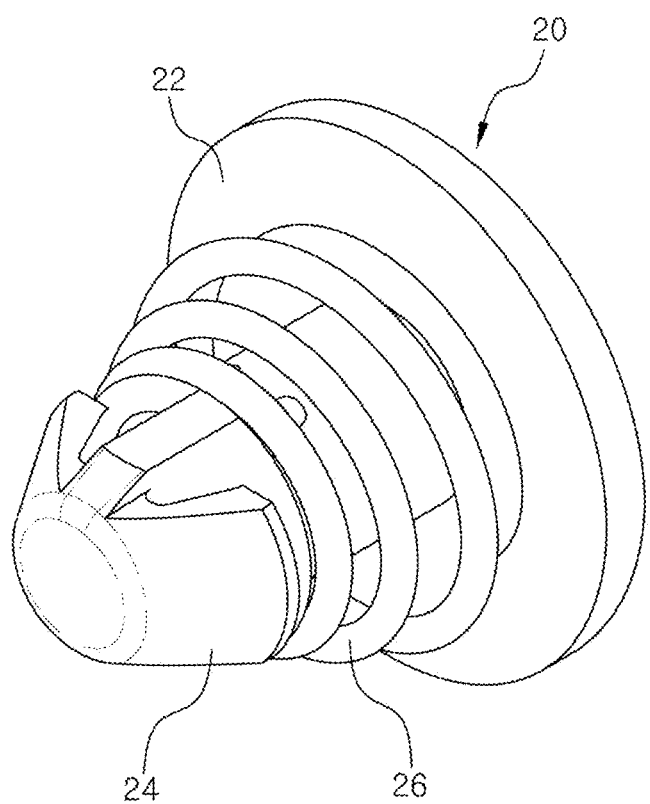
FIG. 6 is a view showing an embodiment of a push pin coupled to a push pin coupling part of the heat dissipation device for a display according to the present disclosure.
Figure 7A:
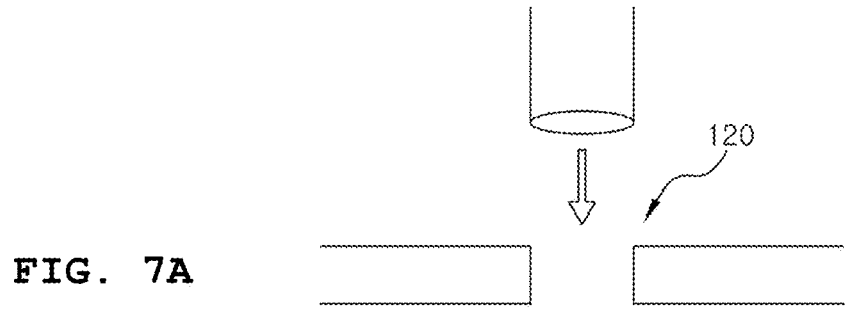
FIG. 7A to FIG. 7C are view schematically showing a process of forming the push pin coupling part on the heatsink unit, in a manufacturing method for the heat dissipation device for a display according to the present disclosure.
Figure 7B:
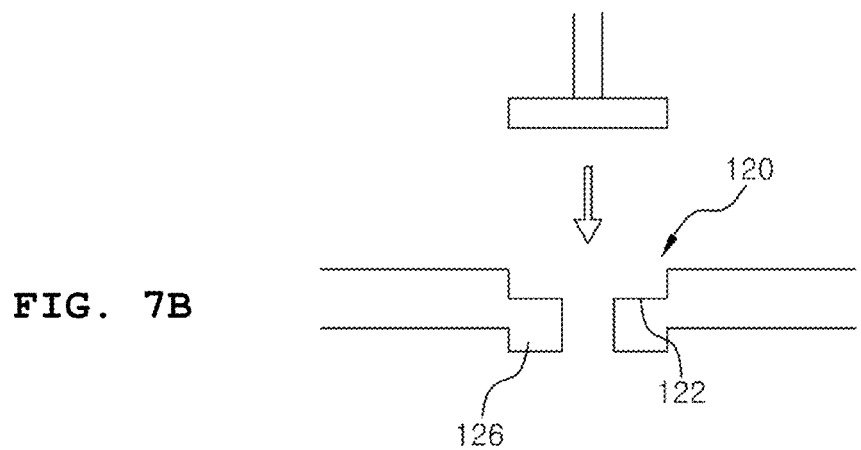
Figure 7C:
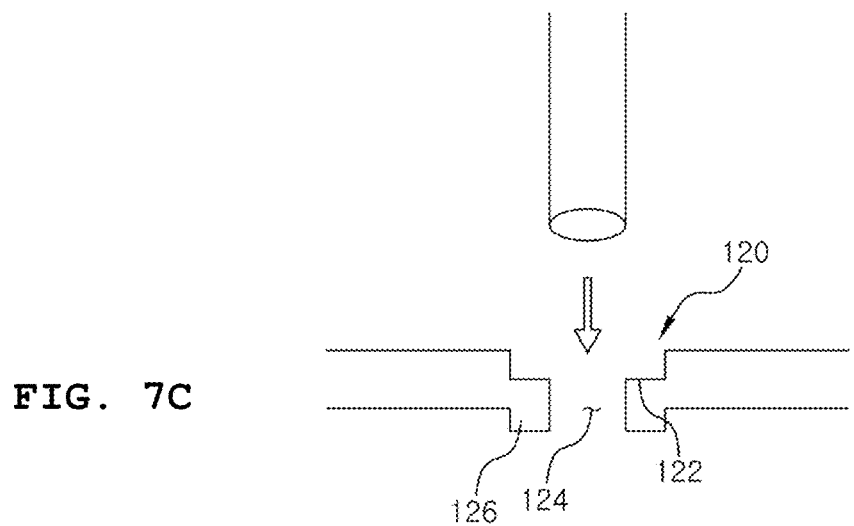

FIG. 1 is a view showing a printed circuit board used for a flat panel display. FIG. 2 is a view showing an embodiment of a heat dissipation device for a display according to the present disclosure. FIG. 3A and FIG. 3B are an upper perspective view and a lower perspective view showing a heatsink unit of the present disclosure shown in FIG. 2. FIG. 4 is a bottom view of the present disclosure shown in FIG. 3A. FIG. 5A and FIG. 5B are side sectional views showing the heatsink unit shown in FIG. 3A and FIG. 3B in comparison with the conventional heatsink unit. FIG. 6 is a view showing an embodiment of a push pin coupled to a push pin coupling part of the heat dissipation device for a display according to the present disclosure. FIG. 7A to FIG. 7C are view schematically showing a process of forming the push pin coupling part on the heatsink unit, in a manufacturing method for the heat dissipation device for a display according to the present disclosure.

The present disclosure relates to a heat dissipation device 1 for a display and a manufacturing method therefor, the heat dissipation device enabling heat generated in a central processing unit provided in a display device to be quickly discharged outwards and being minimized in thickness, thereby realizing slimness of the entire display device. Although the present disclosure described hereinbelow can be applied to various display devices used in various industrial fields, the heat dissipation device 1 used in a flat panel display that is most related to the problem to be solved by the present disclosure will be described as a target.

First, in the flat panel display device to which the heat dissipation device 1 for a display (hereinbelow, which will be referred to as 'the heat dissipation device 1') according to the present disclosure may be applied, as shown in FIG. 1, a printed circuit board 10 including the CPU 12, a push pin coupling tool 14, an EMI gasket 16, etc., is provided.

The heat dissipation device 1 according to the present disclosure is coupled to an upper portion of the printed circuit board 10 and serves to dissipate heat generated in the printed circuit board 10, i.e., usually generated in the CPU 12 outwards. Main component of the heat dissipation device 1 may include a heatsink unit 100, a connection unit 200, and a heat dissipation plate 300, as shown in FIG. 2.

First, the heatsink unit 100 is configured to be bound to the upper portion of the printed circuit board 10 by a push pin 20 made of an electrically conductive material to dissipate heat generated in the CPU 12, etc. in the printed circuit board 10 outwards in a conductive manner, and the heatsink unit 100 may be made of a metal material such as aluminum, etc.

The heatsink unit 100 is usually shaped in a flat panel in order to minimize increasing of the thickness of the display device. The heatsink unit 100 may include a central processing unit (CPU) contacting part 110 brought into contact with the CPU 12 of the printed circuit board 10, a push pin coupling part 120 into which the push pin 20 is inserted and coupled thereto, and an EMI gasket contacting part 130 brought into contact with the EMI gasket 16 of the printed circuit board 10.

In more detail, first, the EMI gasket contacting part 130 is brought into contact with a plurality of EMI gaskets 16 provided the printed circuit board 10 to ground electromagnetic waves generated in electronic components outwards of the display device. The EMI gasket contacting part 130 may have a first inserting groove 132 into which an upper end of the EMI gasket 16 is inserted.

In other words, compared to a conventional case in which a lower surface of the heatsink unit 100 is configured to be simply in contact with the upper end of the EMI gasket 16 as shown in FIG. 5A, according to the present disclosure, as shown in FIG. 5B, the EMI gasket contacting part 130 has the first inserting groove 132 into which the upper end of the EMI gasket 16 is inserted, so that the thickness of the heatsink unit 100 may be reduced as much as the height of the first inserting groove 132.

At this point, when the first inserting groove 132 is formed in the EMI gasket contacting part 130 as described above, a contact area between the EMI gasket 16 and the EMI gasket contacting part 130, i.e., and the first inserting groove 132 is increased and thus the grounding efficiency of electromagnetic waves can be improved.

Meanwhile, the first through hole 134 may be formed as the EMI gasket contacting part 130, and the first through hole 134 may be formed with the same size as the size of the EMI gasket 16 so that an upper side surface of the EMI gasket 16 may be brought into contact with an inner circumferential surface of the first through hole 134, i.e., a side surface thereof.

At this point, the upper end surface of the EMI gasket 16 may be located at a height the same as or lower than an upper surface of the heatsink unit 100, and grounding effect of electromagnetic waves can be obtained even with grounding at the side surface of the EMI gasket 16. Therefore, when the first through hole 134 is used as the EMI gasket contacting part 130 as described above, a slimness effect of up to the thickness of the heatsink unit 100 can be obtained compared to the conventional case.

Furthermore, as will be described later, according to an installation position of the EMI gasket 16, the first inserting groove 132 and the first through hole 134 can be selectively used as the EMI gasket contacting part 130.

Next, the CPU contacting part 110 serves to dissipate heat generated in the CPU 12 by contacting with the CPU 12 provided in the printed circuit board 10. Like the conventional heatsink unit, the CPU contacting part 110 may be formed in a depressed shape in order to be brought in contact with an upper end surface of the CPU 12. On the other hand, the CPU contacting part 110 may be formed at the same height of the surroundings for slimness of the heatsink unit 100, or may be formed in a structure that is bent upwards by a bent part 114 as shown in FIG. 3A and FIG. 5B.

In more detail, the CPU contacting part 110 may be formed in a shape protruding upwards compared to the heatsink unit 100 around the CPU contacting part 110, by the bent part 114. The height of the CPU 12 provided in the printed circuit board 10 is constant and a lower surface of the CPU contacting part 110 should be brought into contact with the upper end surface of the CPU 12. Therefore, a remaining part excluding the CPU contacting part 110 of the heatsink unit 100 is formed to have the height lower than the height of the CPU contacting part 110, and thus even when the CPU contacting part 110 is formed to protrude compared to the surroundings as described above, it does not mean that the entire height of the assembly of the printed circuit board 10 and the heatsink unit 100, i.e., the thickness, is increased.

At this point, a second through hole 112 may be formed in the CPU contacting part 110, and a copper heatsink plate in contact with an upper surface of the CPU 12 of the printed circuit board 10 may be coupled to the second through hole 112.

In more detail, the copper heatsink plate with excellent thermal conductivity compared to aluminum commonly used for a material of the heatsink unit is coupled to the second through hole, so that heat dissipation efficiency can be improved. At this point, the connection unit 200 to be described later may be connected to and installed at the heatsink plate, and the connection unit 200 may also be made of a copper material.

Furthermore, the size of the second through hole 112 is formed same as the size of the upper protrusion of the CPU 12, and the thickness of the heatsink plate us formed thinner than the thickness of the heatsink unit 100, so that the heatsink plate can be coupled to the heatsink unit such that an upper surface of the heatsink plate is integrated to an upper surface of the heatsink unit 100. In this case, a height difference is formed between the lower surface of the heatsink unit 100 and a lower surface of the heatsink plate to allow a part of the upper end of the CPU 12 to be inserted into the second through hole 112.

In other words, as shown in FIG. 1, the upper end of the CPU 12 commonly used for the flat panel display device has a two-stage structure, and the size of the second through hole 112 is formed equally to the size of the upper protrusion of the CPU 12, and the copper heatsink plate coupled to the second through hole 112 is formed to be integrated with the upper surface of the heatsink unit 100 to be reduced in thickness thinner than the thickness of the heatsink unit 100. In this case, a part of the upper end of the CPU 12 of the two-stage structure is inserted into the second through hole 112, so that the entire thickness of the assembly of the heatsink unit 100 and the printed circuit board 10 can be reduced.

Meanwhile, as described above, when the CPU contacting part 110 is formed higher than the surrounding part by the bent part 114, the corresponding part, i.e., the EMI gasket contacting part 130 located at the portion of the heatsink unit 100 formed higher than the surrounding part may be formed as the first through hole 134, and the first inserting groove 132 may be formed in the EMI gasket contacting part 130 located at a relative low position. Therefore, the entire thickness increasing of the heatsink unit 100 can be minimized and simultaneously coupling work of the heat dissipation device 1 according to the present disclosure, i.e., coupling work of the heat dissipation device 1 on the printed circuit board 10 can be performed easily.

In other words, as described later, the heatsink unit 100 of the heat dissipation device 1 according to the present disclosure may be manufactured only by the press processing. When the first inserting groove 132 is formed by the press processing, a surface opposite to the first inserting groove 132, i.e., an upper surface of the heatsink unit 100, must relatively protrude by a pressing force.

The first inserting groove 132 is formed in the heatsink unit 100 located at a relatively low position, so that even when the upper surface of the heatsink unit 100 at the corresponding part protrudes upwards, the entire thickness increasing of the heatsink unit 100 does not occur by the CPU contacting part 110 located a relatively high position. However, when the first inserting groove 132 is formed as the EMI gasket contacting part 130 located in the heatsink unit 100 adjacent to the CPU contacting part 110 formed higher than the surrounding portion, the entire thickness increasing of the heatsink unit 100 must occur, so it is preferable that the first through hole 134 without thickness increasing during the press processing is formed as the EMI gasket contacting part 130 located at the heatsink unit 100 formed higher than the surrounding portions.

Furthermore, when all EMI gasket contacting parts 130 existing in the heatsink unit 100 are formed into first through holes 134, it may be difficult to couple the heatsink unit 100 to the printed circuit board 10 due to a reason such as a processing error, etc. Therefore, even when the first inserting groove 132 is formed, as the EMI gasket contacting part 130 at a position where the entire thickness increasing of the heatsink unit 100 does not occur, it is preferable to use the first inserting groove 132 rather than the first through hole 134.

At this point, although not shown in the drawings, according to the height of the EMI gasket 16 provided in the printed circuit board 10, a portion where the CPU contacting part 110 may be formed into a depressed shape so as to be located at a relatively low position. In this case, on the other hand, the first inserting groove 132 is formed as the EMI gasket contacting part 130 adjacent to the part of the CPU contacting part 110 located at a relatively low height, as the first through hole 134 may be formed as the EMI gasket contacting part 130 formed in the heatsink unit 100 located at a relatively high position.

Next, the push pin coupling part 120 is configured to securely install the push pin 20 binding the heatsink unit 100 to the printed circuit board 10. The push pin coupling part 120 may be formed in a concavely depressed shape as shown in FIG. 3A.

First, the push pin 20 is installed at the push pin coupling part 120 by a medium of a spring 26. As shown in FIG. 6, the push pin 20 may include a pressing part 22 and a head part 24.

The head part 24 is inserted into the push pin coupling tool 14 provided in the printed circuit board 10 to securely install the heatsink unit 100 at the printed circuit board 10. The pressing part 22 is configured to press the head part 24 so that the head part 24 is inserted into and coupled to the push pin coupling tool 14. The detailed configuration of the push pin 20 as described above is already known, and is not intended to be claimed in the present disclosure, and detailed activity relationship thereabout will be omitted.

Furthermore, the push pin coupling part 120 may include a second inserting groove 122 and a third through hole 124. The second inserting groove 122 may serve to support the pressing part 22 of the push pin 20 inserted therein. The third through hole 124 is formed in a center portion of the second inserting groove 122 to allow the head part 24 of the push pin 20 to pass therethrough to be coupled to the push pin coupling tool 14 of the printed circuit board 10.

The second inserting groove 122 is also configured to serve slimness of the assembly of the printed circuit board 10 and the heatsink unit 100. Like the first inserting groove 132 of the EMI gasket contacting part 130 as described above, a slimness effect can be obtained as much as the thickness of the second inserting groove 122 in comparison to the heatsink unit without the second inserting groove 122.

Next, the connection unit 200 is connected to and installed between the heatsink unit 100 and the heat dissipation plate 300 and serve to transmit heat, which is conducted from the printed circuit board 10 to the heatsink unit 100, to the heat dissipation plate 300, and may consist of a common heat pipe.

Next, the heat dissipation plate 300 is connected to and installed at the heatsink unit 100 by the connection unit 200 and serves to dissipate heat conducted from the printed circuit board 10 to the heatsink unit 100, and may include a common heat dissipation fin made of a metal material.

Meanwhile, among the heat dissipation device 1 according to the present disclosure as described above, the heatsink unit 100 may be manufactured in the press processing, which has a relatively low processing cost. Accordingly, the present disclosure has an advantage of reducing a manufacturing cost compared to the conventional heatsink unit 100 usually manufactured in the die casting manner.

In other words, in case of the press processing, the processing cost is relatively low but there is a disadvantage that it is difficult to process complex shapes, and in case of the die casing, it is possible to process complex shapes but there is a disadvantage that the processing cost is relatively higher than the press processing. In case of the heatsink unit 100, processing of a groove or a hole must be necessarily accompanied for slimness and, specifically, in case of the push pin coupling part 120 of the heatsink unit 100, which requires the second inserting groove 122 and the third through hole 124 at the same time, it was difficult to manufacture the push pin coupling part 120 by the press processing alone, so it was common to use the die casting even if the manufacturing cost thereof was high. However, the present disclosure is characterized in that, only by the press processing, the heatsink unit 100 including the push pin coupling part 120 having the above-described configuration can be manufactured.

In more detail, a method of forming the push pin coupling part 120 of the heatsink unit 100 by the press processing method may include a first punching stage, a pressing stage, and a second punching stage. First, the first punching stage, as shown in FIG. 7A, is performed by forming a through hole on the flat heatsink unit 100, the through hole having a diameter larger than a diameter of the push pin 20, by a punching processing using a press device.

Next, the pressing stage may be performed such that a lower surface having a larger diameter than the diameter of the through hole presses downwards a surrounding portion of the through hole by using the pressing tool having a flat shape. By this process, the above-described second inserting groove 122 of the push pin coupling part 120 may be formed.

In other words, as shown in FIG. 7B, as a material is pushed downwards by pressure of the pressing tool, the diameter of the through hole formed in the first punching stage is narrowed and, simultaneously, a protrusion 126 protruding downwards from the lower surface of the heatsink unit 100 may be formed.

At this point, it is preferable that the height of the protrusion 126 is less than or equal to ½ of the thickness of a plate constituting the heatsink unit 100 by adjusting a pressing force of the pressing tool. This is to minimizing thickening of the entire thickness of the heatsink unit 100 due to the protrusion 126.

Next, the second punching stage may be performed by performing the punching processing using the press device again to the through hole that is narrowed in diameter in the pressing stage. In this stage, the third through hole 124 of the push pin coupling part 120 may be formed.

In other words, as described above, since the diameter of the through hole is narrowed while the material is pushed downwards by pressure of the pressing tool in the pressing stage, in the second punching stage, punching work is performed to the through hole portion with the narrowed diameter by using a punching tool corresponding to the diameter of the push pin 20, so that the third through hole 124 through which the head part 24 of the push pin 20 may pass is formed, as shown in FIG. 7C.

A remaining process of manufacturing the heatsink unit 100 excluding the above-described forming process of the push pin coupling part 120, i.e., processes of forming the CPU contacting part 110 and the EMI gasket contacting part 130 are simply forming a groove or a hole, and may be easily performed by the common press device, and a process of connecting and installing the heatsink unit 100 to the heat dissipation plate 300 by the connection unit 200 may be performed by selecting one of conventional various processes of manufacturing the heat dissipation device 1 and a detailed description thereof will be omitted.

Therefore, the heat dissipation device 1 for a display and the manufacturing method therefor according to the present disclosure described above can quickly dissipate heat generated in the CPU 12 provided in the flat panel display device and minimize the thickness of the heat dissipation device 1. Therefore, not only the entire thickness of the display device can be formed slim, but also the heatsink unit 100 can be processed by the press processing with relatively low processing cost alone with minimizing the thickness of the heat dissipation device 1, so that there are various advantages, such as being able to reduce the entire production cost.

Although the above-described embodiments have been described for the most preferred examples of the present disclosure, the present disclosure is not limited thereto, and those skilled in the art will appreciate that various modifications, additions and substitutions are possible, without departing from the scope and spirit of the preset disclosure.

INDUSTRIAL APPLICABILITY

The present disclosure relates to a heat dissipation device for a display and a manufacturing method therefor. More particularly, the present disclosure relates to a heat dissipation device for a display and a manufacturing method therefor, the heat dissipation device enabling heat generated in a central processing unit provided in a flat panel display device to be quickly discharged and enabling the overall thickness of the heat dissipation device, so that slimness of the overall thickness of the display device can be achieved.

The invention claimed is:

1. A heat dissipation device for a display, the heat dissipation device comprising a flat panel heatsink unit comprising a central processing unit (CPU) contacting part, a push pin coupling part, and an EMI gasket contacting part, and a heat dissipation plate connected to and installed at the heatsink unit,
wherein the EMI gasket contacting part has a first inserting groove into which an upper end of an EMI gasket is inserted.

2. A heat dissipation device for a display, the heat dissipation device comprising a flat panel heatsink unit comprising a central processing unit (CPU) contacting part, a push pin coupling part, and an EMI gasket contacting part, and a heat dissipation plate connected to and installed at the heatsink unit,
wherein the EMI gasket contacting part has a first through hole, and is configured to support an inside surface of the first through hole to be in contact therewith.

3. A heat dissipation device for a display, the heat dissipation device comprising a flat panel heatsink unit comprising a central processing unit (CPU) contacting part, a push pin coupling part, and an EMI gasket contacting part, and a heat dissipation plate connected to and installed at the heatsink unit,
wherein the CPU contacting part protrudes upwards or depresses downwards by a bent part to cause a height difference from the heatsink unit around the CPU contacting part,
a first through hole into which an upper end of the EMI gasket is inserted is formed at the EMI gasket contacting part formed in the heatsink unit located at a relatively high position, and
a first inserting groove into which the upper end of the EMI gasket is inserted is formed at the EMI gasket contacting part formed in the heatsink unit located at a relatively low position.

4. The heat dissipation device of claim 1, wherein the push pin coupling part has a second inserting groove into which a pressing part of a push pin is inserted, and a center portion of the second inserting groove has a third through hole through which a head part of the push pin passes.

5. The heat dissipation device of claim 2, wherein the push pin coupling part has a second inserting groove into which a pressing part of a push pin is inserted, and a center portion of the second inserting groove has a third through hole through which a head part of the push pin passes.

6. The heat dissipation device of claim 3, wherein the push pin coupling part has a second inserting groove into which a pressing part of a push pin is inserted, and a center portion of the second inserting groove has a third through hole through which a head part of the push pin passes.

* * * * *